United States Patent [19]

Rolfson

[11] Patent Number: 5,358,892
[45] Date of Patent: Oct. 25, 1994

[54] ETCH STOP USEFUL IN AVOIDING SUBSTRATE PITTING WITH POLY BUFFERED LOCOS

[75] Inventor: J. Brett Rolfson, Boise, Id.

[73] Assignee: Micron Semiconductor, Inc., Boise, Id.

[21] Appl. No.: 17,100

[22] Filed: Feb. 11, 1993

[51] Int. Cl.$^5$ .................................................. H01L 21/76
[52] U.S. Cl. ........................................ 437/70; 437/69; 437/920; 437/978; 148/DIG. 156
[58] Field of Search ................. 437/69, 70, 920, 978; 148/DIG. 156

[56] References Cited

U.S. PATENT DOCUMENTS

| 4,541,167 | 9/1985 | Havemann | 576/29 |
| 4,868,136 | 9/1989 | Ravagua | 437/67 |

FOREIGN PATENT DOCUMENTS

| 0022342 | 2/1984 | Japan | 437/70 |
| 0081649 | 4/1986 | Japan | 437/69 |
| 0087741 | 4/1988 | Japan | 437/69 |
| 0137457 | 6/1988 | Japan | 437/70 |
| 0155747 | 6/1988 | Japan | 437/70 |
| 0260639 | 10/1990 | Japan | 437/70 |

OTHER PUBLICATIONS

Ghandhi, "VLSI Fabrication Principles", 1983, pp. 479-482 and pp. 495-497.
Toshiyuki Nishihara et al., "A 0.5 um Isolation Technology Using Advanced Poly Silicon Pad LOCOS (APPL)", *IEEE*, 1988, pp. 100-103.
H. S. Yang et al., "Poly void Formation in Poly Buffer LOCOS Process", Extended Abstracts of the Spring Electrochemical Society meeting, 1992, p. 442.
J. M. Sung, "The Impact of Poly-Removal Techniques on Thin Thermal Oxide Property in Poly-Buffer LOCOS Technology", *IEEE Transactions on Electron Devices*, Aug. 1991, pp. 1970-1973.
Stanley Wolf, "A Review of IC Isolation Technologies—Part 6", *Solid State Technology*, Dec. 1992, pp. 39-41.
R. L. Guldi, "Characterization of Poly-Buffered LOCOS in Manufacturing Environment", *J. Electrochem. Soc.*, Dec. 1989, pp. 3815-3820.
Tin-hwang Lin, "Twin-White-Ribbon Effect and Pit Formation Mechanism in PBLOCOS", *J. Electrochem. Soc.*, Jul. 1991, pp. 2145-2149.
M. Ghezzo, "LOPOS: Advanced Device Isolation for a 0.8 um CMOS/BULK Process Technology", *Journal of The Electrochemical Society*, Jul. 1989, pp. 1992-1996.

*Primary Examiner*—Tom Thomas
*Assistant Examiner*—Trung Dang
*Attorney, Agent, or Firm*—Lia M. Pappas

[57] ABSTRACT

Active regions on a semiconductor substrate are isolated, whereby an Oxide/Nitride/Oxide sandwich is disposed on a substrate, and a polysilicon layer and a nitride layer are also disposed thereon. The Oxide/Nitride/Oxide sandwich substantially inhibits "pitting" of the substrate when the polysilicon layer is removed.

Method of preventing "pitting" of an underlying substrate through the use of a nitride (or other HF-resistant material) disposed beneath the polysilicon layer of a Poly Buffered LOCOS stack.

21 Claims, 2 Drawing Sheets

ETCH STOP USEFUL IN AVOIDING SUBSTRATE PITTING WITH POLY BUFFERED LOCOS

FIELD OF THE INVENTION

This invention relates to semiconductor manufacture, and more particularly to methods of isolating active areas on a semiconductor substrate.

BACKGROUND OF THE INVENTION

As device dimensions get smaller, and device density increases, it becomes more and more difficult to build an efficient and reliable isolation process to separate active devices. The main drawback with the conventional LOCal Oxidation of Silicon (LOCOS), is the existence of a long "bird's beak" length or oxide encroachment into the active device region of the substrate which limits usable active device area.

The limits of the standard LOCOS process have motivated the search for, and the development of new isolation schemes. Poly Buffered LOCOS (PBL) employs a thin polysilicon layer between the oxide and nitride films in the LOCOS stack.

PBL facilitates design rule shrinking and smaller cell size required for submicron and sub-half-micron device fabrication. This isolation scheme utilizes an oxide/poly/nitride sandwich to block oxidation of the active regions during field oxidation growth. The presence of the intermediate poly layer allows the oxide to be thinned and nitride thickened without generating undue stress in the active regions in order to reduce encroachment during the field oxidation step.

Unfortunately, in standard poly buffered LOCOS processing, the substrate has been found to pit after the pad oxide has been stripped. The pitting becomes more severe as the active area dimensions are reduced to the submicron regime. This "pitting" phenomenon is discussed in "Poly-void Formation in Poly Buffer LOCOS Process," by H. S. Yang, et al., and also in "Twin-White-Ribbon Effect and Pit Formation Mechanism in PBLOCOS," by Tin-hwang Lin, et al.

In the isolation process, once the field oxide has been grown, the nitride and polysilicon layers are removed over the active area regions. It is during the removal process of the polysilicon layer when pitting of the active areas occurs due to exposure of the substrate to the etchants used for removing the polysilicon layer. As a result the exposed substrate becomes "pitted" by the etchant chemicals.

SUMMARY OF THE INVENTION

The process of the present invention teaches the addition of an essentially impervious layer to the poly buffered LOCOS stack. The layer comprises, for example $Si_3N_4$ or other substance which is relatively impermeable to the process chemicals used in stripping the polysilicon and nitride layers from the stack.

The nitride layer is preferably disposed in an oxide/nitride/oxide sandwich beneath the polysilicon layer for the purpose of reducing defects, such as pitting, in the semiconductor substrate.

Alternatively, the nitride layer can be disposed on the pad oxide layer, and the polysilicon can be disposed directly thereon, without the additional oxide layer.

BRIEF DESCRIPTION OF THE DRAWINGS

The present invention will be better understood from reading the following description of non-limitative embodiments, with reference to the attached drawings, wherein below.

DETAILED DESCRIPTION OF THE INVENTION

Figure 1:
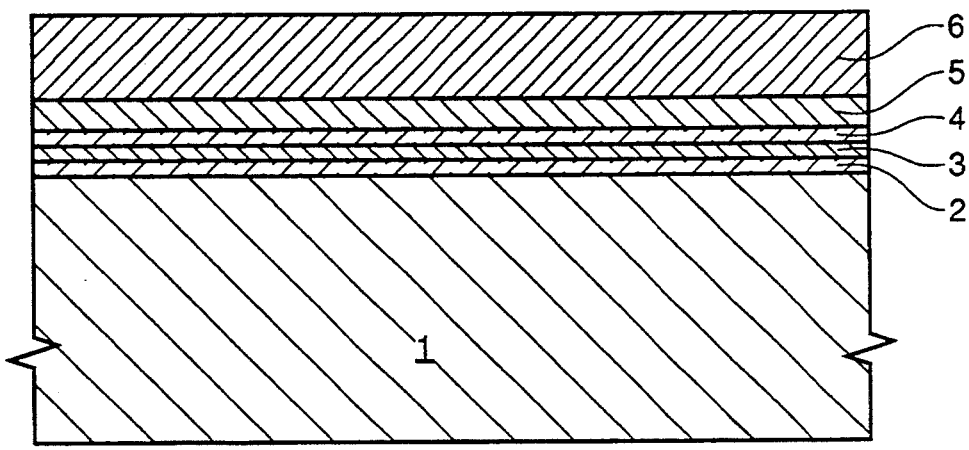
FIG. 1 is a schematic cross-section of isolation stack formed by the process of the present invention.

Referring to FIG. 1, a semiconductor substrate 1, preferably bare silicon (Si) is oxidized at approximately 800° C. to produce a pad oxide 2. The preferred embodiment has a pad oxide 2 thickness greater than 100 Å, preferably 120 Å. The oxide layer 2 can be deposited or thermally grown. Stress-relief is one purpose served by the pad oxide layer 2. Alternatively, one may choose to employ an oxide layer having a thickness less than 100 Å, for example in the approximate range of 80 Å.

An "etch-stop" layer 3, preferably a nitride, is then deposited, preferably by low pressure chemical vapor deposition (LPCVD), at approximately 800° C. to create a layer having a preferred thickness of approximately 100 Å.

The nitride layer 3 displays a relative imperviousness to the chemicals and etchants used in the removal of the polysilicon layer 5 and the thick nitride layer 6 from the PBL stack.

Nitride is the preferred material, however, other suitable materials, including but not limited to tantalum pentoxide, indium tin oxide, and high temperature metals, may also be used.

In an alternative embodiment, the impervious layer 3 may be disposed directly on the substrate 1, without the oxide layer 2 therebetween. However, an underlying oxide layer 2 is preferred as it affords some protection to the substrate 1.

In the preferred embodiment, another oxidation step is then performed, preferably in a wet or steam ambient at approximately 900° C. to result in a re-ox layer 4 having a preferred thickness in the approximate range of 10–30 Å. This re-ox layer 4 can also be deposited by any of the methods currently known in the art.

At this point, a preferably undoped buffer polysilicon layer 5 is deposited, preferably by LPCVD, at approximately 625° C. at a preferred thickness of approximately 500 Å. However, it is possible to use doped polysilicon.

Alternatively, the polysilicon layer 5 can be directly deposited on the thin nitride layer 3, without the oxide layer 4 disposed therebetween.

The polysilicon 5 functions as a stress-relief layer, hence the term, "buffer". Polysilicon is currently the preferred buffer material, but any material which allows the pad oxide 2 to be thin and the superjacent nitride 6 to be thickened, without generating undue stress in the active regions may be used.

Figure 3:
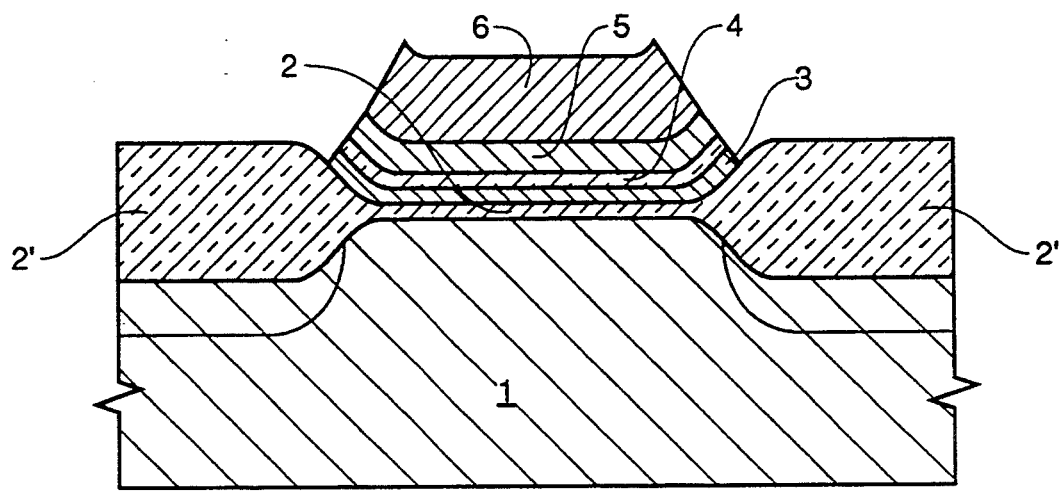
FIG. 3 is a schematic cross-section of the isolation stack of FIG. 2, after the stack has been patterned and etched, and a field oxidation performed, according to the process of the present invention.
Figure 4:
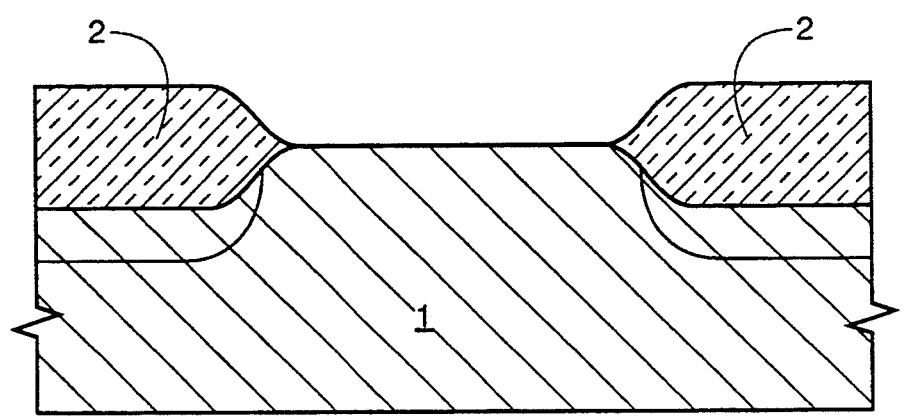
FIG. 4 is a schematic cross-section of the area under the isolation stack, after the isolation stack has been removed according to the process of the present invention.

A layer 6 of material which inhibits oxidation of the buffer layer 5, e.g. the polysilicon layer, is deposited. Preferably, layer 6 is a nitride layer which is deposited by LPCVD, at approximately 800° C. for a preferred thickness in the approximate range of 2400 Å. Layer 6 serves as an oxidation mask for the creation of field oxide 2', as shown in FIGS. 3 and 4.

The nitride stack is then patterned with photoresist 7 using conventional lithography techniques or other suitable method known in the art. In the preferred embodiment, an etch step is then performed in which the unpatterned areas are etched back to the pad oxide layer 2. Alternatively, the pad oxide layer 2 may be partially etched or completely removed.

Figure 2:
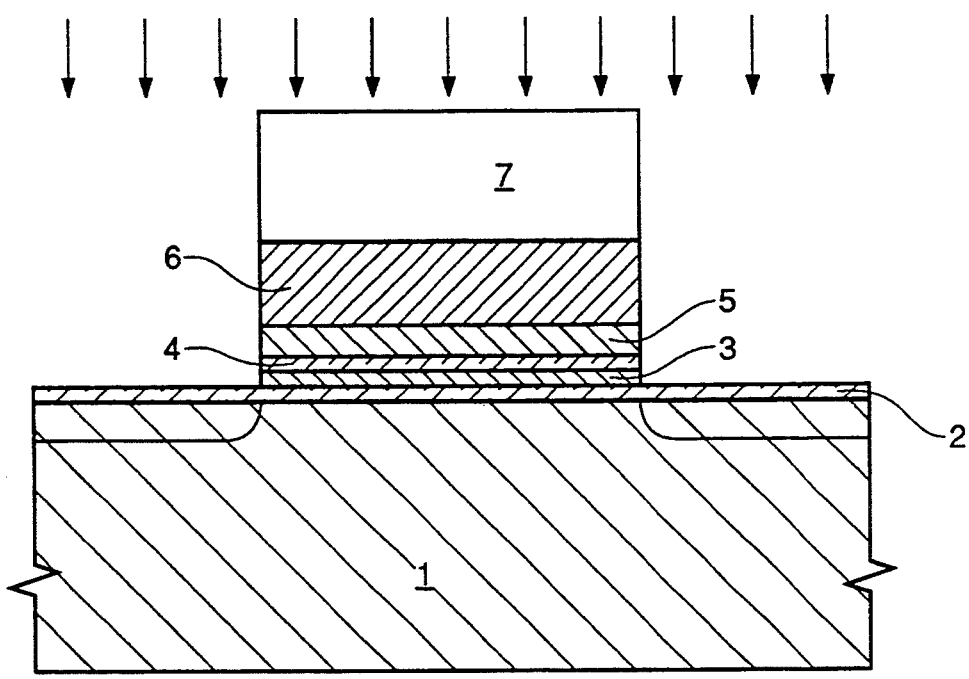
FIG. 2 is a schematic cross-section of isolation stack of FIG. 1, after it has been patterned and etched according to the process of the present invention.

The etch is preferably an anisotropic etch which results in side walls which are substantially normal to the substrate surface 1, as seen in FIG. 2. Preferably the etch is performed using a $Cl_2$-based chemistry in a reactive ion etcher (R.I.E.). However, other etch chemistries, such as $CHF_3$, may also be used.

The photoresist layer 7 is then removed using methods well known in the art, for example a heated mixture of sulfuric acid ($H_2SO_4$) and hydrogen peroxide ($H_2O_2$).

An implant may be done at this point to increase dopant concentration in field region, if desired.

FIG. 3, illustrates, the structure following a field oxidation step, which results in an oxide layer 2' having a preferred thickness in the approximate range of 4000 Å. The oxidation is preferably carried out in a wet or steam ambient at a temperature in the approximate range of 1030° C.

After the oxidation step, it is necessary to sequentially remove any oxide which may have grown on the nitride layer 6, the nitride layer 6, any oxide which may have grown on the polysilicon layer 5, the polysilicon layer 5, oxide layer 4, and nitride layer 3. This strip can be done in a dry plasma environment or by use of sequential wet chemical etchants.

The preferred embodiment employs wet chemical etchants and will be described in detail below:

A buffered oxide etch is performed at an approximate temperature of 30° C. This etch "decaps" or substantially removes any oxidation which has occurred on top of the second nitride layer 6 to allow the phosphoric acid used in the subsequent step to "attack" or etch the layers below.

The nitride layer 6 is then "stripped" or removed in hot phosphoric acid ($H_3PO_4$) at an approximate temperature of 150° C. for approximately 145 minutes.

The next layer to be removed is the polysilicon buffer layer 5. The polysilicon 5 is "decapped" in a hydrogen fluoride (HF) ambient for approximately 120 seconds. This step is undertaken to substantially remove any oxidants which may have grown on the buffer layer 5.

It is believed that the pitting problem of the underlying substrate previously described occurs if the HF "attacks" the underlying pad oxide layer. The subsequent step for removal of polysilicon in wet polysilicon etchants, is believed to cause pitting problem when the wet etchants "attack" the underlying substrate at those sites where the HF penetrated the polysilicon layer and etched some of the pad oxide away, thereby exposing the substrate. Using the process of the present invention, such pitting does not occur because the silicon nitride layer provides a barrier to the HF etch.

After the polysilicon 5 is "decapped," the polysilicon 5 is then "stripped" by disposing it in wet polysilicon etchants at approximately 30° C.-60° C. for about 1-20 minutes.

The next step is a wet buffered oxide etch "decap" which is performed at approximately 30° C. This etch removes the oxide layer 4.

The nitride layer 3 is then "stripped" or removed in hot phosphoric acid at approximately 150° C. for about 10 minutes.

The pad oxide 2 can then be removed, in HF for about 45 seconds. FIG. 4 illustrates the isolated active area after the various layers have been removed. Alternatively, the pad oxide layer 2 may be left on the substrate 1.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims.

For example, one having ordinary skill in the art will realize that the oxide/nitride/oxide sandwich of the present invention can also function as an etch stop. Such an etch stop could be used underneath a layer such as a cell node. The cell node is preferably defined and etched by any of the suitable methods known in the art. Phosphorous is then deposited to "dope" the polysilicon, which produces a phosphorous/oxide compound that is commonly "deglazed" in hydrofluoric (HF) acid. Without the oxide/nitride/oxide etch-stop of the present invention beneath the polysilicon of the cell node, the HF is able to attack the underlying functional structures, thereby rendering the device non-functional.

What is claimed is:

1. A method for preventing substrate damage during semiconductor fabrication, said method comprising the following steps of:
   creating a first oxide layer on a semiconductor substrate;
   depositing a resistant layer superjacent said first oxide layer;
   re-oxidizing said resistant layer;
   depositing a polysilicon layer superjacent said re-oxidized layer;
   depositing a material which inhibits oxidation of said polysilicon layer superjacent said polysilicon layer, said layers forming a stack;
   patterning said stack to create designated areas, said areas having a periphery;
   anisotropically etching all of said layers of said stack outside of said periphery; and
   oxidizing outside of said periphery.

2. The method according to claim 1, wherein said resistant layer is at least one of a nitride, indium tin oxide, tantalum pentoxide, and a high temperature metal.

3. The method according to claim 1, further comprising the step of:
   selectively removing said layers of said stack, thereby exposing said areas.

4. The method according to claim 1, wherein said re-oxidized layer has a thickness of less than 20 Å.

5. The method according to claim 1, wherein said anisotropic etch uses chlorine chemistries, said anisotropic etch forming substantially vertical sidewalls on said stack.

6. A process for isolating active areas on a semiconductor substrate, said process comprising the following steps of:

creating an oxide/nitride/oxide sandwich on a semiconductor substrate using thermal re-oxidation;

disposing a buffer layer superjacent said sandwich;

disposing a nitride layer superjacent said buffer layer;

masking said nitride layer, said nitride layer having masked portions and unmasked portions;

anisotropically etching said unmasked portions of said nitride layer through said buffer layer and said sandwich; and oxidizing said substrate.

7. The isolation process according to claim 6, wherein said thermal re-oxidation is performed in a steam ambient.

8. The isolation process according to claim 6, wherein said thermal re-oxidation is performed at a temperature substantially in an approximate range of 900° C.

9. The isolation process according to claim 6, further comprising the steps of:

removing said masked portions of said nitride layer removing said buffer layer; and removing said oxide/nitride/oxide sandwich.

10. The isolation process according to claim 7, wherein said nitride layer is approximately 2400 Å.

11. The isolation process according to claim 10, wherein said buffer layer comprises polysilicon.

12. The isolation process according to claim 6, wherein said oxide/nitride/oxide sandwich is substantially in the range of 120 Å oxide/100 Å nitride/10 Å oxide.

13. A process for manufacture of semiconductors, said process comprising the following steps of:

creating a pad oxide superjacent a semiconductor substrate;

disposing a first nitride layer superjacent said pad oxide;

re-oxidizing said first nitride layer;

disposing a buffer layer superjacent said re-oxidizing nitride layer;

disposing a second nitride layer superjacent said buffer layer;

said layers forming a stack;

patterning said stack of layers, thereby creating patterned and unpatterned portions; and anisotropically etching all of said layers of said stack in said unpatterned portions, thereby exposing said pad oxide.

14. The process according to claim 13, further comprising the step of:

further oxidizing said exposed pad oxide.

15. The process according to claim 14, further comprising the step of:

removing said layers of said stack.

16. The process according to claim 15, wherein said nitride layers are removed using phosphoric acid.

17. The process according to claim 15, wherein said buffer layer comprises polysilicon.

18. The process according to claim 17, wherein said polysilicon is removed using at least one of hydrofluoric acid and wet polysilicon etchants.

19. The process according to claim 18, wherein said first nitride prevents said hydrofluoric acid from penetrating said pad oxide.

20. The process according to claim 18, wherein said first nitride prevents said wet polysilicon etchants from penetrating said pad oxide and attacking said substrate.

21. The process according to claim 13, wherein said re-oxidized layer is in the approximate range of 10 Å.

* * * * *